United States Patent [19]

Ogawa

[11] 4,205,271
[45] May 27, 1980

[54] CONTROL DEVICE OF ELECTRONIC PRESET TYPE TUNER FOR MULTI-BAND RADIO RECEIVER

[75] Inventor: Tadashi Ogawa, Tokorozawa, Japan

[73] Assignee: Pioneer Electronic Corporation, Tokyo, Japan

[21] Appl. No.: 911,850

[22] Filed: Jun. 2, 1978

[30] Foreign Application Priority Data

Jun. 3, 1977 [JP] Japan .................................. 52/66069
Jun. 9, 1977 [JP] Japan .................................. 52/68305
Jun. 10, 1977 [JP] Japan .................................. 52/68495

[51] Int. Cl.² ............................................. H04B 1/16
[52] U.S. Cl. ............................................. 455/186
[58] Field of Search ............... 325/455, 457, 458, 459, 325/464, 465, 468, 470; 358/191, 192

[56] References Cited

U.S. PATENT DOCUMENTS

| | | | |
|---|---|---|---|
| 3,953,801 | 4/1976 | Podowski | 325/464 |
| 3,961,261 | 6/1976 | Pflasterer | 325/459 |
| 3,968,440 | 7/1976 | Ehni | 325/464 |
| 4,041,402 | 8/1977 | Mogi | 325/465 |
| 4,085,372 | 4/1978 | Mogi et al. | 325/464 |

Primary Examiner—Robert L. Griffin
Assistant Examiner—Jin F. Ng
Attorney, Agent, or Firm—Sughrue, Rothwell, Mion, Zinn and Macpeak

[57] ABSTRACT

An electronic preset type tuning control device of a tuner using a varactor diode means for multi-band radio receiver is disclosed, which comprises a manually operable tuning pulse generator capable of generating a clock signal and an up or down pulse signal which may be controlled manually, an up/down counter responsive to the output of the pulse generator to produce a binary signal corresponding thereto, a random access read/write memory for storing the binary signal at addresses assigned by a pair of ganged band selector switches a channel selector switch and a preset switch, a digital-analog converter responsive to the binary signal to convert it into a d.c. signal which is fed to the varactor means to tune the tuner to a desired frequency and a control means responsive to the outputs of the preset switch, the band selector switch and the channel selector switch for reading out the data stored in the memory to cause the counter to transmit it to the digital-analog converter without chattering noise due to the operations of the switches.

4 Claims, 4 Drawing Figures

CONTROL DEVICE OF ELECTRONIC PRESET TYPE TUNER FOR MULTI-BAND RADIO RECEIVER

BACKGROUND OF THE INVENTION

This invention relates to a multi-band radio receiver and, in more particular, to an electronic tuning device for the multi-band receiver, in which the bands and the channels can be preset digitally.

The radio receiver has been improved in various manners according to the recent developments of electronic engineerings and one of the results is disclosed in Japanese Utility Model application No. 11353/1975 in which a preset type multi-band receiver has a varactor diode tuner and a control therefor. The control comprises a channel selector switch means, a memory to be addressed by outputs of the channel selector switch, an up-down counter to be set by a manual pulse generator signal or a channel signal readout from the preset memory address and a digital-analog converter for converting an output of the counter into an analog signal, which is to be supplied to the variable capacitor (Varactor) diode equipped in a radio receiver which forms a tuning circuit reponsive to the analog signal for tuning it to a desired signal in the preset channel.

In this case, the channel selector switch means is composed of plurality of non-lock type switches.

The up-down counter is controlled by the output of the memory every time a channel selector signal from either one of the channel selector switches is detected. For a multi-band receiver, a band selector switch may be converted to the channel selector switches in series therewith.

In this case, however, since the output of the channel selector switch is different from that of the band selector switch in the standby state, that is, all of contacts of the channel selector switches are in off-state or low state, while band selector switch is on except instances of the band selection between the adjacent bands. Therefore, in order to detect the outputs of the both switches having different standby states, at least two kinds of circuits are necessary.

Further, although this type electronic tuner allows a relatively large number of preset informations to be set reliably, the channel selection becomes relatively complicated because the memory supplies the information to the up-down counter according to the output of the channel selector switch. In other words, assuming, for example, that the channel is to be changed from channel number 3 in A band to channel number 3 in B band, that is, when the channel is changed from a certain channel number in one band to the same channel number in an other band, it is necessary to operate, the channel selector switch contact corresponding to channel 3 again after the band selector switch is switched from A to B.

In addition to these defects, a chattering noise problem is severe because it utilizes a mechanical switch contact mechanism. That is, in this electronic tuning system, the outputs of mechanical switches are very important and if the outputs include chattering noises the system may malfunction. In order to eliminate the chattering problem, it has been usual to make the construction of the switch system itself special or to provide various chattering noise cancelling circuits.

However, these solutions make the system complex, expensive and unreliable.

SUMMARY OF THE INVENTION

A primary object of the present invention is to improve the conventional electronic preset tuning type radio receiver having the mechanical switches so that the outputs of the channel selector switches and the band selector switch thereof can be detected with a single detection device.

Another object of the present invention is to improve the conventional electronic preset tuning type radio receiver having the mechanical switches so that, when the channel to be selected in one band is the same channel in another band, a channel selection can be performed by operating only the band selector switch.

A further object of the present invention is to improve the conventional electronic preset tuning type radio receiver having the mechanical switches so that the chattering noise due to the actuations of the mechanical switch contacts which adversely influence the whole system can be prevented.

DETAILED DESCRIPTION OF THE EMBODIMENTS

Figure 1:
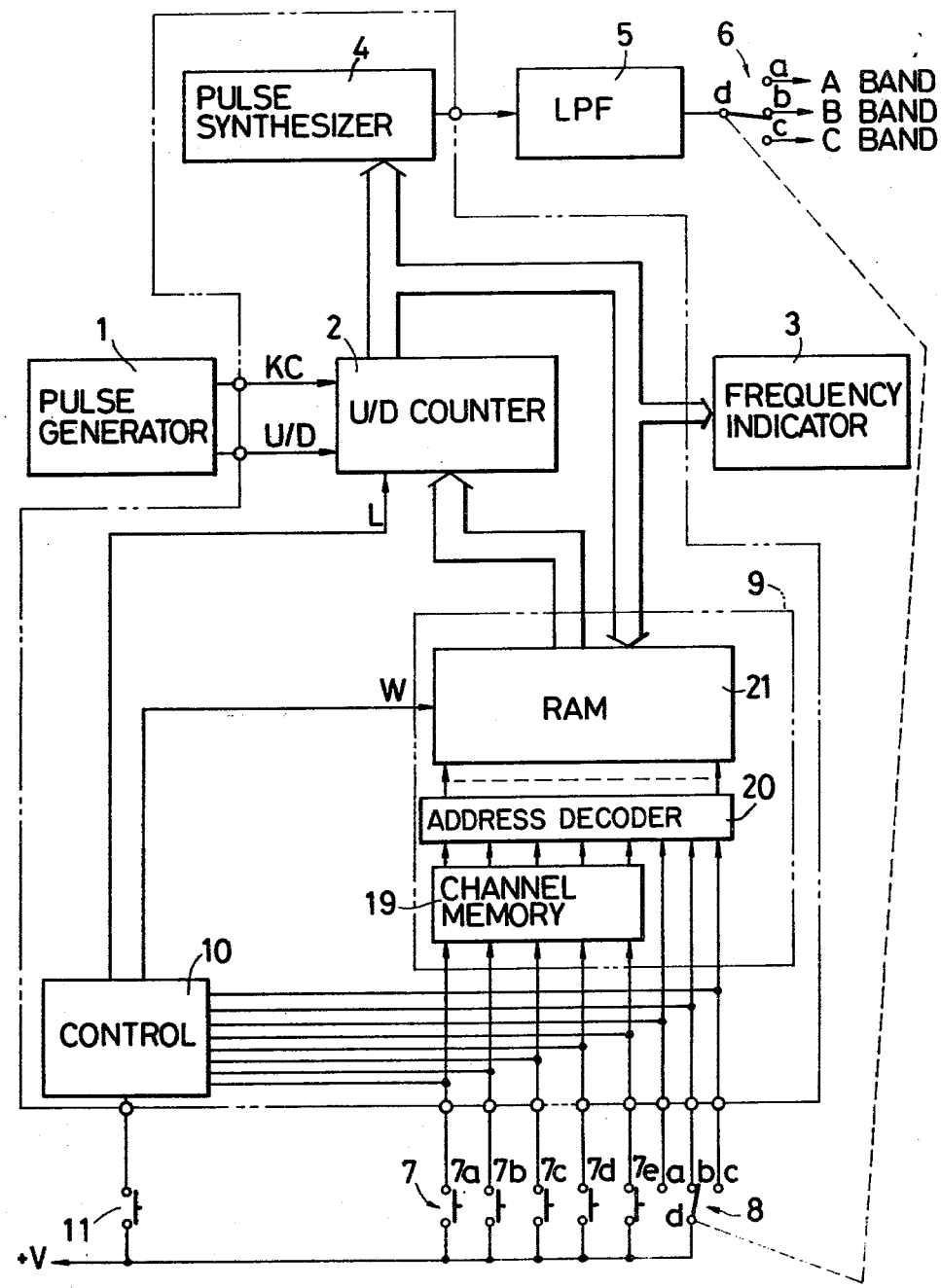
FIG. 1 is a schematic block circuit diagram of an embodiment of the present invention.

In FIG. 1, a pulse generator 1 has a pair of output terminals at one of which tuning pulses are produced manually and at the other of which clock pulses KC are generated. The tuning pulses are either up count pulses U or down pulses D depending on the direction of the manual operation of the generator. The output terminals of the pulse generator 1 are connected to a binary up/down counter 2 which counts up or down the clock pulses KC depending on the up or down pulses from the pulse generator 1.

A portion of an output of the U/D counter 2 is fed to a frequency indicator 3 which is, in this embodiment, a digital indicator.

The frequency indicator 3 provides an indication of the selected frequency by using some most significant bits of the parallel count output of the U/D counter 2. The output of the U/D counter 2 is also fed to an input of a pulse synthesizer 4 which, according to the output of the U/D counter, provides a serial pulse train including a predetermined number of pulses corresponding to the output of the U/D counter 2. An output of the pulse synthesizer 4 is fed to a low pass filter 5. The low pass filter 5 and the pulse synthesizer 4 constitute a digital-analog converter. A contact d of a first band selector switch 6 is connected to an output of the low pass filter 5. The band selector switch 6 has three contacts a, b and c, in this embodiment, which are connected to varactor diodes in tuning circuits for bands A, B and C, respectively.

A channel selector switch means 7 is constituted with a plurality of non-lock type switches 7a to 7e. One sides of the switches 7a to 7e are commonly connected to a voltage source +V.

A second band selector switch 8 is ganged with the band selector switch 6 and a contact arm d thereof is connected to the common connection of the switches 7a to 7b.

A random access read/write memory (RAM) comprises a channel memory 19 having inputs connected to the channel selector switches 7c and 7e, respectively, an address decoder 20 having inputs connected to the output of the channel memory 19 and inputs connected to the contacts a, b, c of the band selector switch 8 and a RAM 21 having input connected to outputs of the address decoder 30 and latches the outputs of these switches so that, according to the outputs of the latter, the output of the up/down counter 2 is stored in an assigned address of the RAM which is readout therefrom and fed to the counter 2 according to demand.

Figure 2:
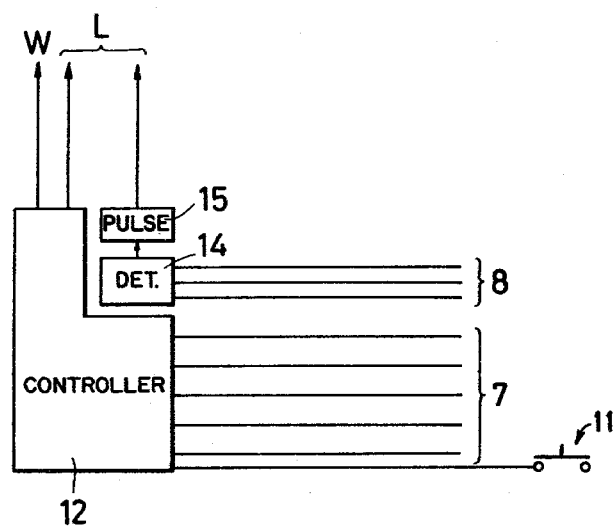
FIG. 2 is a schematic block circuit diagram of the control in FIG. 1.

A controller circuit 10 has an input connected to one side of a preset switch 11 the other side of which is connected to the common connection of the channel selector switch means 7 and the band selector switch 8. The function of the control circuit 10 is to supply a load signal L to the U/D counter 2 when the preset switch 11 is off and an output is provided by any one of the channel selector switches 7a to 7e and to supply a write signal W to the RAM 9 when the preset switch 11 is on. The control circuit 10 may take various forms and according to an embodiment in FIG. 2, it includes a controller 12 having an input connected to the preset switch and a plurality of inputs connected to the other sides of the switches 7a to 7e. The band selection detector 14 has three inputs connected to the contacts a, b and c of the switch 8, respectively. The load pulse generator 15 has an input connected to an output of the band selection detector 14. The controller 12 provides a load signal output and a write signal output to the U/D counter and the RAM 9, respectively.

The band switch detector 14 detects the band selected and causes the load pulse generator 15 to supply a load pulse to the U/D counter.

Figure 3:
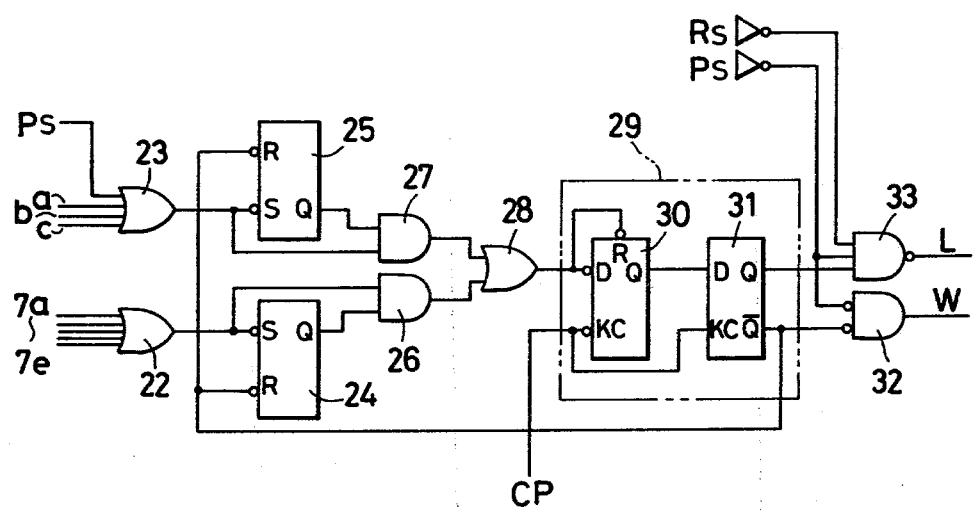
FIG. 3 is a schematic block circuit diagram of another embodiment of the control in FIG. 1.

According to another embodiment in FIG. 3, the control circuit 10 comprises an OR gate 22 having inputs connected to the channel selector switches 7a to 7e, respectively, and an OR gate 23 having four inputs, three of them being connected to the contacts a, b and c of the band selector switch 8 and the remaining one input being connected to the preset switch 11 and supplied with a preset output Ps therefrom, an output of the OR gate 22 being connected to a set input of a flip-flop 24 and an output of the OR gate 23 being connected to a set input of a another flip-flop 25. The reset inputs of the flip-flops 24 and 25 are commonly connected.

The set input of the flip-flop 24 is also connected to one input of an AND gate 26 the other input of which is connected to an output of the flip-flop 24.

The set input of the flip-flop 24 is also connected to one input of an AND gate 27 the other input of which is connected to an output of the flip-flop 25. Outputs of the AND gates 26 and 27 are connected to inputs of an OR gate 28, respectively.

The control circuit 10 in FIG. 3 may have a chattering noise cancelling circuit 29 connected to an output of the OR gate 8.

The chattering noise cancelling circuit 29 comprises a latch circuit 30 and a flip-flop 31. The output of the OR gate 28 is connected to a data input and a reset input of the flip-flop 30. The latter has a clock input to which a clock pulse CP is supplied from a suitable source. An output of the flip-flop 30 is connected to a data input of the flip-flop 31 whose clock input is supplied with the clock pulse CP.

A set output Q of the flip-flop 31 is connected to a first input of a NAND gate 33 and a reset output $\overline{Q}$ of the flip-flop 31 is connected to a first input of a NOR gate 32, to which the common connection of the reset inputs of the flip-flops 24 and 25 is connected.

To second inputs of the NOR gate 32 and the NAND gate 33 the preset signal Ps is supplied from the preset switch 11. The NAND gate 33 has further a third input to which a reset signal Rs is supplied. An output of the NOR gate 32 is connected to the RAM 9 to supply the write signal and a output of the NAND gate 33 is connected to the U/D counter 2 to supply the load signal.

In manual operation, when one operates the pulse generator 1 in one direction to generate the up-pulses U, for example, the latter is supplied to the U/D counter 2 causing it to count up the clock pulses KC from the pulse generator 1. The parallel outputs of the U/D counter 2 are coupled to the stages of the pulse synthesizer 4, respectively. Stages of the pulse synthesizer 4 are capable of providing different frequency signals, which may be given by frequency-dividing an oscillation frequency signal by different divisors, respectively, according to the parallel outputs of the U/D counter 2. The synthesizer 4 synthesizes different frequency signals produced by the stages thereof according to the output of the U/D counter to produce a serial pulse train containing pulses the number of which corresponds to the output of the U/D counter. The serial pulse train from the pulse synthesizer 4 is fed to the low pass filter 5 to remove a high frequency conponent thereof to produce a, dc voltage signal corresponding to the output of the U/D counter 2. The dc voltage signal is fed to a varactor diode of one of tuning circuits (not shown) which was selected by the band selector switch 6 to obtain a tuning against the corresponding frequency.

A suitable number of most significant bits of the output of the U/D counter 2 are fed to the frequency indicator 3 to visually and digitally indicate the frequency being received.

In preset operation, it is asssumed that a desired channel in a desired band has been selected in the manner described above.

By turning the preset switch 11 on and then turning any selected one of the channel selector switches 7a to 7e on a write signal W is generated in the control circuit 10 and fed to the RAM 9, so that the count output of the U/D counter 2, i.e., a digital signal corresponding to the tuned frequency being received can be stored in an address of the RAM 9 assigned by the band selector switch 8 and the selected one of the switches 7a to 7e. Thus, certain channels in certain bands can be preset in the RAM, individually.

A certain channel in a certain band which is thus preset is selected by selecting the contact of the band selector switch and the channel selector switch corresponding thereto. Since, at the selection of the band selector contact and the channel selector switch, the preset switch 11 is off, the control circuit 10 supplies the load signal L to the U/D counter. As a result, the parallel readout signal from the RAM 9 which receives the outputs from the band selector switch 8 and the channel selector switch 7 as an address to be readout is fed to the U/D counter 2.

The U/D counter 2 provides an output as mentioned before which is fed to the pulse synthesizer 4, in the same manner as in the manual operation.

The change in channel in the same band can be performed by merely selecting a desired channel selector switch to be on.

When only the band is to be changed while the channel number is fixed, it is sufficient to switch the contact of the band selector switch 8 to a desired band.

Describing the control circuit 10 in more detail with respect to the embodiment in FIG. 3, in the standby state, the channel selector switches 7a to 7e are all off and the band selector switch 8 is in a position in which one of the bands is selected. Therefore the output of the OR gate 22 is "0" and the output of the OR gate 23 is "1". The flip-flop 24 is set by the output "0" of the OR gate 22 and the output of the AND gate 26 is "0". Also in the standby state, the flip-flop 25 is not set due to the "1" output of the OR gate 23 and therefore the output of the AND gate 27 is "0". Accordingly, even if the outputs of the switches in different states are input to the AND gates 26 and 27, the outputs of these gates are "0" and the set outputs Q of the latch 30 and the flip-flop 31 are also "0".

In the case where any one of the channel selector switches 7a to 7e is selected and makes a circuit, the output of the OR gate 22 changes from "0" to "1". In this case, if there is no chattering noise in the output from the selected switch, there may be a coincidence of the "1" output of the OR gate 22 and the set output Q of the flip-flop 24 with the change of the OR gate output from "0" to "1", causing the output of the AND gate 26 to be "1".

Therefore, the latch 30 becomes in the latch mode with the falling edge of the clock pulse CP and the set output Q of the latch 30 is held at "1". With the latch output of "1", the flip-flop 31 is set at the next rising edge of the clock pulse CP to provide "1" output at the set terminal Q and the flip-flops 24 and 25 as well as the latch 30 are reset by the reset output $\bar{Q}$ of the flip-flop 31. Therefore, the output Q of the latch 31 becomes "0" and the flip-flop 31 is reset at the rising edge of the next clock pulse CP. Thus the standby state is recovered.

Therefore, the flip-flop 31 provides its output during a period of the clock pulse CP.

Then, when the band selector switch 8 is operated to change the band, all of the channel selector switches 7a to 7e are made off instantaneously. As a result, the output of the OR gate 23 becomes "0" temporarily. With the output "0" of the OR gate 23, the flip-flop 25 is set. When the output of the OR gate 23 is returned to "1", the output of the AND gate 27 becomes "1" by which the band selection is detected.

Figure 4:
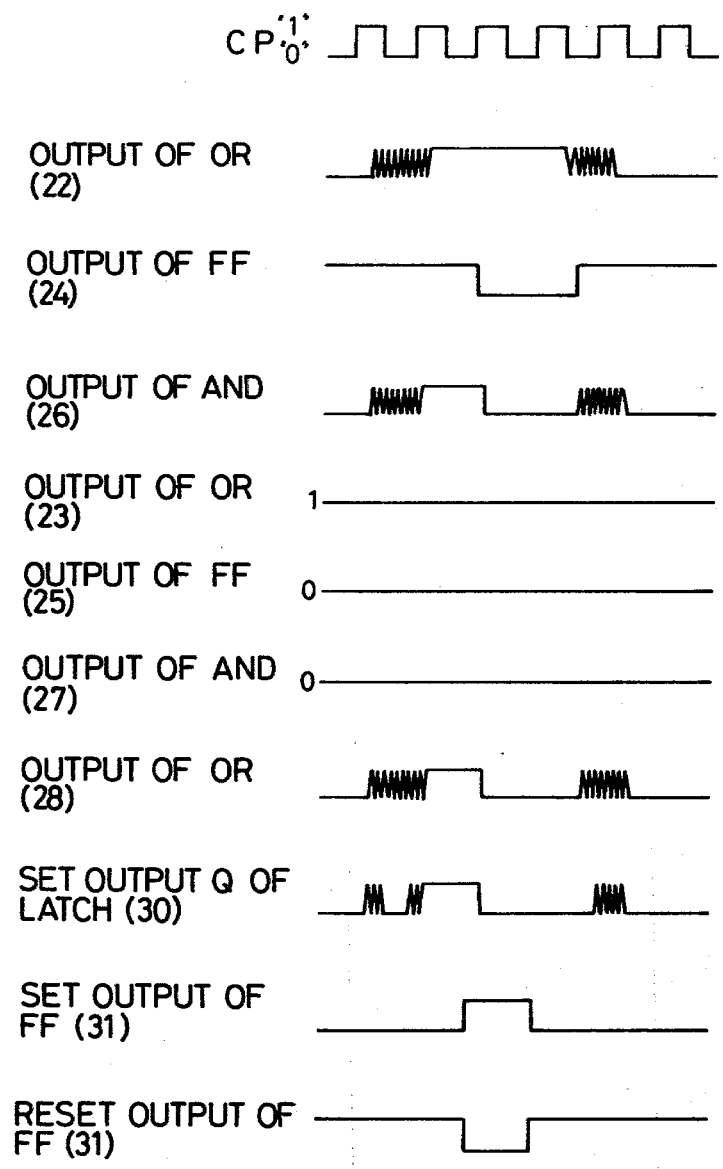
FIG. 4 is waveforms at various points in the control circuit in FIG. 3.

The above is the explanation of the operation of the control circuit 10 when there is no chattering of the switch contacts. The operation of the circuit 10 when there are included chattering noises in the outputs of the channel selector switches 7a to 7e will be described with reference to FIG. 4.

The chattering noise included in the output of the channel selector switch means 7 may appear in the output of the OR gate 22, as well as in the output of the AND gate 26. Therefore, the chattering noise appears in the set output Q of the latch 30 when the clock pulse CP is in a "1" state. On the other hand, if the data input of the latch 30 becomes "0" while the clock pulse CP is in the " " state, the latch 30 is reset. Therefore the flip-flop 31 can not be switched even at the rising time of the clock pulse. Accordingly, in order to make the chattering noise cancelling circuit 29 possible to provide a set output, the "1" state of the output of the OR gate 22 must be held at least until the termination of the "0" state of the next clock pulse CP. Accordingly, if the chattering noise width is within a half period of the clock pulse CP, the chattering can be ignored. In this case, since the outputs of the respective channel selector switches are not synchronized with the clock pulse, there is a difference in transmitting time of the channel selector switch output, which depends on the state of the clock pulse at the time when the channel selector switch is changed and the clock pulse is sent at ½–3/2 period of the clock pulse CP after the chattering noise at the rising portion of the data pulse. Thus, the flip-flop 31 provides the set output Q and, when the reset switch and the preset switch 11 are off and the reset signal Rs and the preset signal Ps are "0 ", the NAND gate 33 provides a "0" signal referred to as the load signal L including no chattering noise. Further, when the preset switch 11 is on and the preset signal Ps is "1", only the output of the AND gate 32 becomes "1" providing the write signal W. Thus the chattering noise can be effectively cancelled even if it is included in the output of the OR gate 23, i.e., the output of the band selector switch 8.

The following table 1 is a truth table of the latch 31.

Table 1

| truth table (positive logic) of the latch 31 | | | |
|---|---|---|---|
| D | R | KC | Q |
| 1 | 1 | 1 | 1 |
| 0 | 1 | 1 | 1 |
| * | 1 | 0 | latch mode |
| * | 0 | * | 0 |

*"1" or "0"

As described hereinbefore, according to the present invention, it becomes possible to much simplify the channel selection and to exclude the effect of chattering noise. It should be understood that the present chattering noise prevention circuit can also be applied to other digital circuit devices.

What is claimed is:

1. In an electronic preset type tuning device for a multi-band radio receiver having a plurality of tuning circuits which tuning device includes a preset switch, a pulse generator capable of generating clock pulses and up or down count pulses, a first band selector switch, a second band selector switch ganged with said first band selector switch and connected to said tuning circuits, a plurality of channel selector switches, a random access memory addressed by outputs from said first band selector switch and said channel selector switches, an up-/down counter responsive to the up or down count pulses for counting up or down the clock pulses, a digital-to-analog converter responsive to an output of said up/down counter for converting said up/down counter output into an analog signal to be fed through said second band selector switch to the tuning circuits, said counter being responsive to a load signal for receiving output data from said random access memory and supplying said data to said converter, said random access memory being responsive to a write signal for storing an output from said counter, said tuning device further characterized by a control circuit comprising:

a band selector detector having inputs connected to said first band selector switch for detecting a selected frequency band;

a first load signal generator connected to said band selection detector and in response thereto for generating a load signal to be supplied to said up/down counter; and a controller connected to said preset switch and said channel selector switches for providing a load signal in response to an output from any one of said channel selector switches and providing a write signal to said radom access memory in response to outputs from said preset switch and any one of said channel selector switches.

2. In an electronic preset type tuning device for a multi-band radio receiver having a plurality of tuning circuits which tuning device includes a preset switch, a pulse generator capable of generating clock pulses and up or down count pulses, a first band selector switch, a second band selector switch ganged with said first band selector switch and connected to said tuning circuits, a plurality of channel selector switches, a random access memory addressed by outputs from said first band selector switch and said channel selector switches, an up/down counter responsive to the up or down count pulses for counting up or down the clock pulses, a digital-to-analog converter responsive to an output of said up/down counter for converting said up/down counter output into an analog signal to be fed through said second band selector switch to the tuning circuits, said counter being responsive to a load signal for receiving output data from said random access memory and supplying said data to said converter, said random access memory being responsive to a write signal for storing an output from said counter, said tuning device further characterized by a control circuit comprising:

a first OR gate having inputs connected to said first band selector switch and said preset switch;

a second OR gate having inputs connected to said channel selector switches;

a flip-flop having a set input connected to an output of said first OR gate;

a second flip-flop having a set input connected to an output of said second OR gate;

a first AND gate having inputs connected to said set input and an output of said first flip-flop;

a second AND gate having inputs connected to said set input and an output of said second flip-flop;

a third OR gate having inputs connected to outputs of said first and second AND gates;

a NAND gate for receiving outputs from said third OR gate, a reset switch and a preset switch and providing a load signal output to a load input of said up/down counter; and a NOR gate having inputs connected to said preset switch and the reset inputs of said first and second flip-flops and providing a write signal output to a write input of said random access memory, said control circuit being responsive to output information from said preset switch said first band selector switch and any one of said channel selector switches to supply a write signal to said random access memory for storing the content of said up/down counter, and responsive to the information from said first band selector switch and any one of said channel selector switches to supply a load signal to said up/down counter for loading into said counter the output data from said random access memory.

3. The control circuit as claimed in claim 2, further comprising a chattering noise cancelling circuit connected between said third OR gate and NAND and NOR gates.

4. The control circuit as claimed in claim 3, wherein said chattering noise cancelling circuit comprises a latch circuit having a data input connected to the output of said third OR gate, a reset input connected to the output of said third OR gate, a clock input and an output and a flip-flop circuit having a data input connected to said output of said latch circuit, a clock input and, a pair of outputs connected to said NAND gate and said NOR gate, respectively.

* * * * *